(12) United States Patent
Yu

(10) Patent No.: US 10,455,723 B2
(45) Date of Patent: Oct. 22, 2019

(54) SERVER CASING

(71) Applicant: PEGATRON CORPORATION, Taipei (TW)

(72) Inventor: Chih-Wei Yu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 2 days.

(21) Appl. No.: 15/940,682

(22) Filed: Mar. 29, 2018

(65) Prior Publication Data

US 2018/0317338 A1    Nov. 1, 2018

(30) Foreign Application Priority Data

Apr. 26, 2017    (TW) .............................. 106114008 A

(51) Int. Cl.
  *H05K 7/18*    (2006.01)
  *H05K 7/14*    (2006.01)

(52) U.S. Cl.
  CPC ............. *H05K 7/18* (2013.01); *H05K 7/1487* (2013.01)

(58) Field of Classification Search
  CPC ...... H05K 7/18; H05K 7/1487; H05K 7/1488; H05K 7/183; H05K 7/1485; H05K 7/1411; H05K 5/0217
  See application file for complete search history.

(56) References Cited

U.S. PATENT DOCUMENTS

| | | | | |
|---|---|---|---|---|
| 3,272,581 A | * | 9/1966 | Stucki ................ | A47B 47/025 312/234.4 |
| 3,807,572 A | * | 4/1974 | Luvara ............... | A47B 47/042 211/10 |
| 5,877,938 A | * | 3/1999 | Hobbs .................... | G06F 1/183 312/223.2 |
| 8,047,383 B2 | * | 11/2011 | Hendrix ............... | H05K 7/1425 211/26 |
| 2007/0174850 A1 | * | 7/2007 | El Zur .................. | G06F 13/385 719/321 |
| 2008/0310123 A1 | * | 12/2008 | Sherrod ............... | H05K 7/1488 361/725 |
| 2012/0181241 A1 | * | 7/2012 | Fan ......................... | G06F 1/188 211/26.2 |
| 2013/0009529 A1 | * | 1/2013 | Zhu ........................ | G06F 1/187 312/223.2 |
| 2017/0339799 A1 | * | 11/2017 | Su ........................ | H05K 7/1489 |
| 2018/0116066 A1 | * | 4/2018 | Good .................... | H05K 7/1487 |

FOREIGN PATENT DOCUMENTS

| | | |
|---|---|---|
| TW | 201304648 | 1/2013 |
| TW | 201508444 | 3/2015 |
| TW | 201703609 | 1/2017 |

* cited by examiner

*Primary Examiner* — Hoa C Nguyen
*Assistant Examiner* — Christopher L Augustin
(74) *Attorney, Agent, or Firm* — J.C. Patents

(57) ABSTRACT

A server casing including a casing box and a partition structure is provided. The casing box includes first, second, third and fourth lateral walls connected sequentially and collectively form an accommodating space. The partition structure is detachably disposed in the casing box so as to divide the accommodating space to a plurality of areas. The partition structure includes a main partition and two main fixing sheet sets vertically extending from two opposite edges of the main partition towards opposite directions, and the two main fixing sheet sets are detachably fixed to the first and the third lateral walls of the casing box.

9 Claims, 6 Drawing Sheets

SERVER CASING

CROSS-REFERENCE TO RELATED APPLICATION

This application claims the priority benefit of Taiwan application serial no. 106114008, filed on Apr. 26, 2017. The entirety of the above-mentioned patent application is hereby incorporated by reference herein and made a part of this specification.

BACKGROUND OF THE INVENTION

1. Field of the Invention

The invention relates to a casing, and particularly relates to a server casing.

2. Description of Related Art

Rack servers are a type of servers whose appearances are designed based on a unified standard. A server casing is a frame body adapted to accommodate a plurality of modules. In other words, a casing may be considered as an empty housing having predetermined width and height. The server casing only includes frame slots and back plates adapted to accommodate and connect various modules, and servers installed in the casing are installed to and removed from the casing as modules. In general, the widths of servers have different sizes referred to as "half-width" or "full-width", where "full-width" indicates a width of 19 inches. Also, the heights of servers are represented by using "U" as a unit, where 1 U is equal to 1.75 inches (or 44.45 millimeters). Heights such as 1 U or 2 U are common heights.

A plurality of servers is commonly installed to a server casing. Various arrangements are possible, such as installing two full-width 1 U servers to a full-width 2 U casing, installing two half-width 2 U servers to a full-width 2 U casing, or installing one full-width 1 U server and two half-width 1 U servers to the full-width 2 U casing. However, the designer normally determines the combination of servers as desired in advance and then designs and manufactures internal partitions corresponding to the server casing, so as to support the servers to be installed. Currently, the server casing can only accommodate the servers in the predetermined sizes, and the users are unable to modify the configuration of the casing.

SUMMARY OF THE INVENTION

One or some exemplary embodiments of the invention provide a server casing allowing the user to modify a configuration of partitions. In addition, the server casing is easy to install or detach. Therefore, the server casing offers a greater flexibility of use.

A server casing according to an embodiment of the invention includes a casing box and a partition structure. The casing box includes a first lateral wall, a second lateral wall, a third lateral wall and a fourth lateral wall connected sequentially and collectively forming an accommodating space. The partition structure is detachably disposed in the casing box so as to divide the accommodating space to a plurality of areas. The partition structure includes a main partition and two main fixing sheet sets. The two main fixing sheet sets vertically extend from two opposite edges of the main partition towards opposite directions, respectively, and are detachably fixed to the first and the third lateral walls of the casing box.

According to an embodiment of the invention, the two main fixing sheet sets are fastened to the first lateral wall and the third lateral wall by at least one screw.

According to an embodiment of the invention, the two main fixing sheet sets are respectively divided into two first sections and two second sections in an extending direction of the main partition. The two first sections are closer to a front side of the server casing than the two second sections, and the two main fixing sheet sets respectively include a plurality of screw holes located in the two first sections.

According to an embodiment of the invention, a plurality of hooks are respectively provided on surfaces of the first lateral wall and the third lateral wall of the casing box facing toward each other. The hooks of the first lateral surface and the hooks of the third lateral surface extend in opposite directions and are respectively hooked to the two main fixing sheet sets.

According to an embodiment of the invention, the two main fixing sheet sets are respectively divided into two first sections and two second sections in an extending direction of the main partition. The two first sections are closer to a front side of the server casing than the two second sections, and the hooks are respectively hooked to the two second sections of the two main fixing sheet sets.

According to an embodiment of the invention, the partition structure further includes a first auxiliary partition and a first auxiliary fixing sheet set. The first auxiliary partition vertically extends from a surface of the main partition, the first auxiliary fixing sheet set vertically extends from an edge of the first auxiliary partition and is parallel to the main partition, and the first auxiliary fixing sheet set is detachably fixed to one of the second lateral wall and the fourth lateral wall of the casing box.

According to an embodiment of the invention, extending directions of the two main fixing sheet sets from the main partition and an extending direction of the first auxiliary fixing sheet set from the first auxiliary partition are all clockwise or are all counter-clockwise.

According to an embodiment of the invention, the partition structure further includes a second auxiliary partition and a second auxiliary fixing sheet set. The second auxiliary partition vertically extends from another surface of the main partition, the second auxiliary fixing sheet set vertically extends from an edge of the second auxiliary partition and is parallel to the main partition, and the second auxiliary fixing sheet set is detachably fixed to the other of the second lateral wall and the fourth lateral wall of the casing box.

According to an embodiment of the invention, extending directions of the two main fixing sheet sets from the main partition, an extending direction of the first auxiliary fixing sheet set from the first auxiliary partition, and an extending direction of the second auxiliary fixing sheet set from the second auxiliary partition are all clockwise or are all counter-clockwise.

According to an embodiment of the invention, the first auxiliary partition and the second auxiliary partition are respectively located at corresponding positions on two opposite surfaces of the main partition.

Based on the above, in the embodiments of the invention, the partition structure is detachably disposed in the casing box of the server casing. Accordingly, the user may decide whether to replace the partition structure or to not use the partition structure. In addition, the two main fixing sheet sets of the partition structure respectively extend from two opposite edges of the main partition, and are perpendicular to the main partition and extend in opposite directions. Therefore, the shape of the main partition and the two main fixing sheet set is close to a "Z" shape. When the partition structure is desired to be detached from the casing box, the user may firstly release a fixing relation (e.g., releasing the fastening and/or engagement relation) between the two main fixing sheet sets and the first and third lateral walls, and then rotate the partition structure to an inclined position, and the partition structure can be removed. By designing the shape of the main partition and the two main fixing sheet sets to be similar to the "Z" shape, the interference of the first and third lateral walls during rotation may be avoided. Similarly, when the partition structure is desired to be installed to the casing box, the user may place the main partition and the two main fixing sheet sets in the "Z" shape into the casing box at an inclined angle, and then rotate the partition structure to a position where the two main fixing sheet sets to be parallel to the first and third lateral walls of the casing box. By designing the shape of the main partition and the two main fixing sheet sets to be similar to the "Z" shape, the interference of the first and third lateral walls during rotation may be avoided, and the two main fixing sheet sets may be rotated to the predetermined positions. Then, the two main fixing sheet sets are fixed to the first lateral wall and the third lateral walls. Thus, with the server casing according to the embodiments of the invention, the user may adjust sizes of areas divided by the partition structure in the casing box according to sizes of the servers desired to be installed in the server casing. Thus, the user has more flexibility to make adjustment. Moreover, the Z-shaped design avoids the interference with respect to the casing box during installation or removal, so the partition structure is easy to install and remove.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
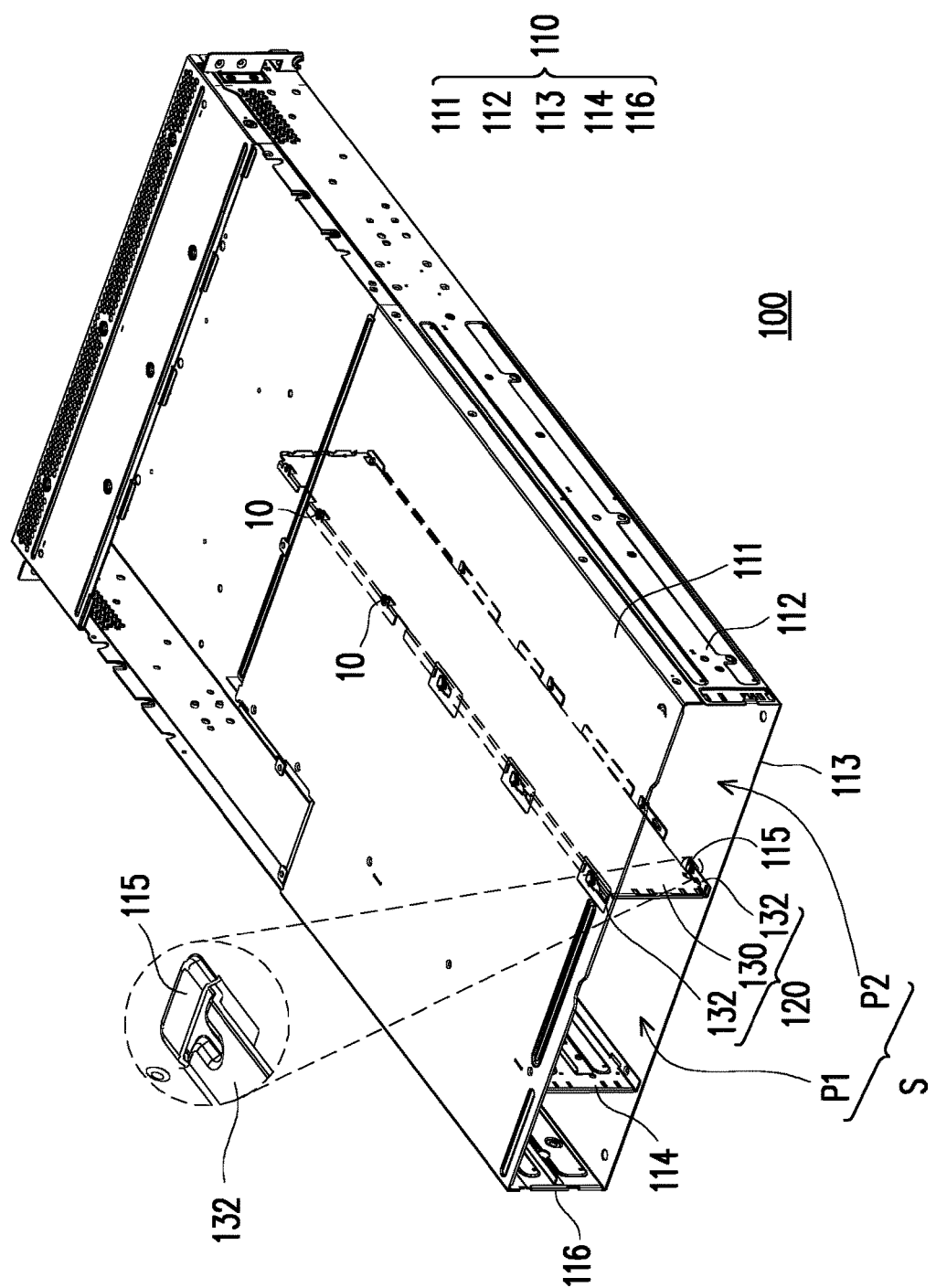
FIG. 1A is a schematic perspective view illustrating a server casing according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
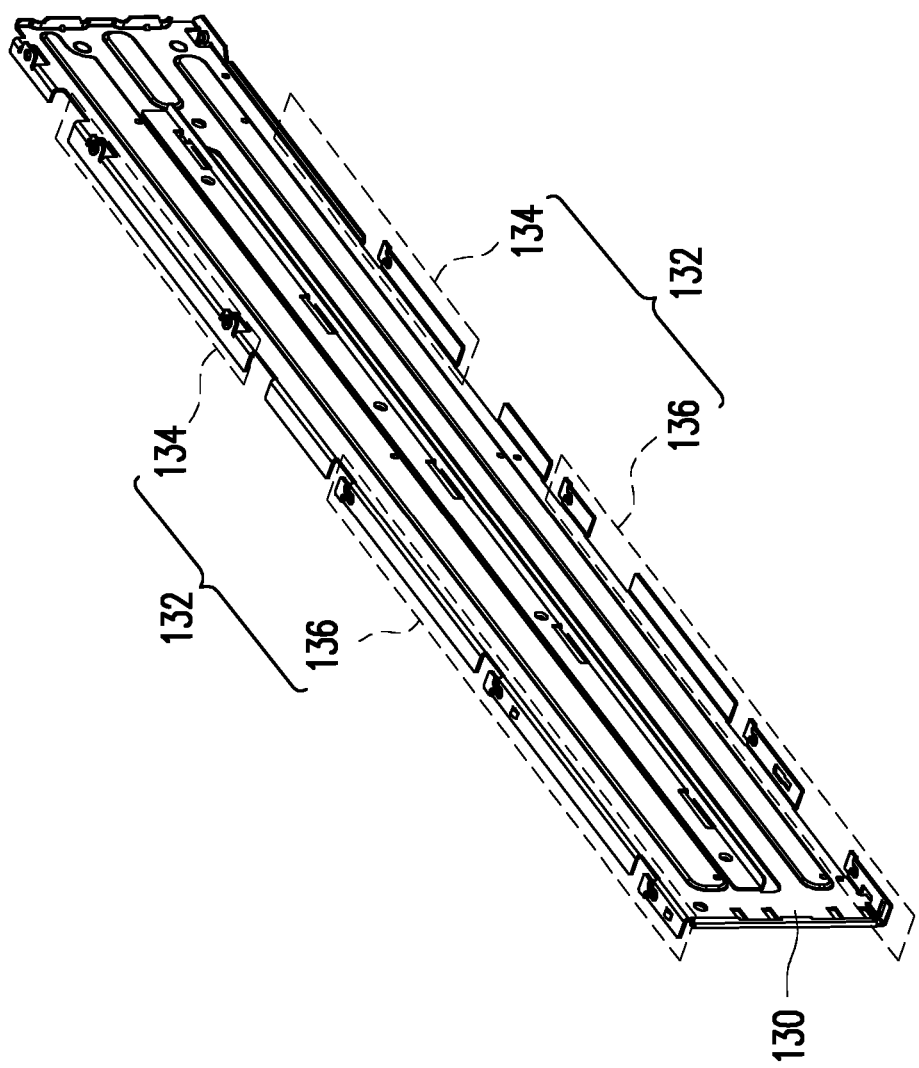
FIG. 1B is a schematic perspective view illustrating a partition structure of the server casing of FIG. 1A.
Figure 2:
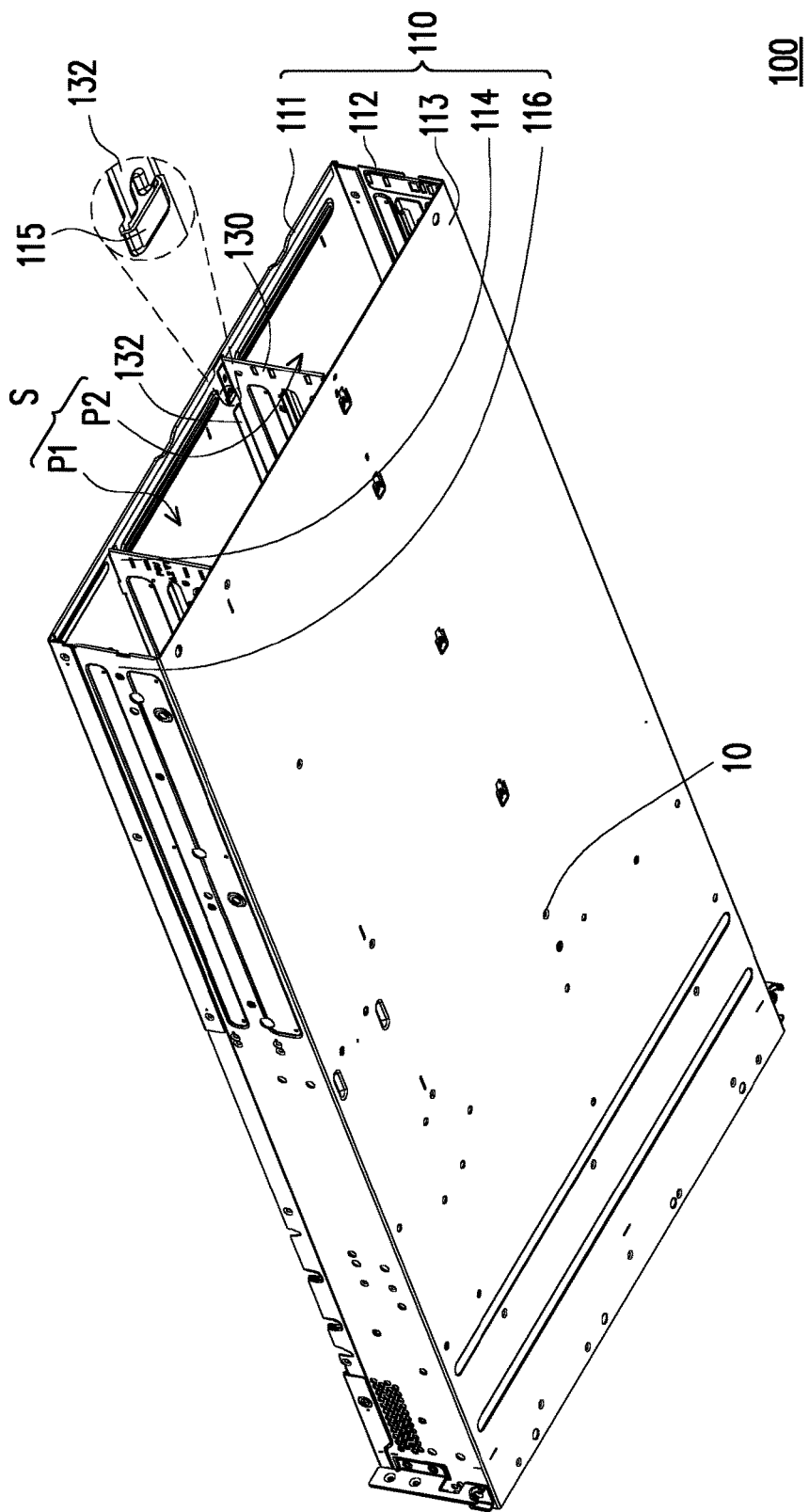
FIG. 2 is a schematic perspective view illustrating the server casing of FIG. 1A from another perspective.
Figure 3:
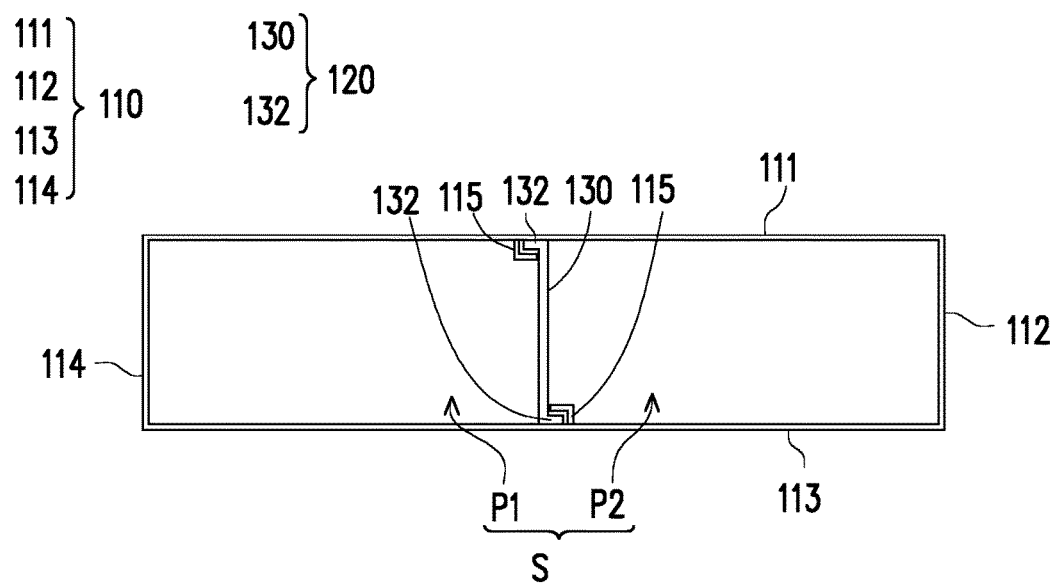
FIG. 3 is a schematic partial side view illustrating the server casing of FIG. 1A.
Figure 4:
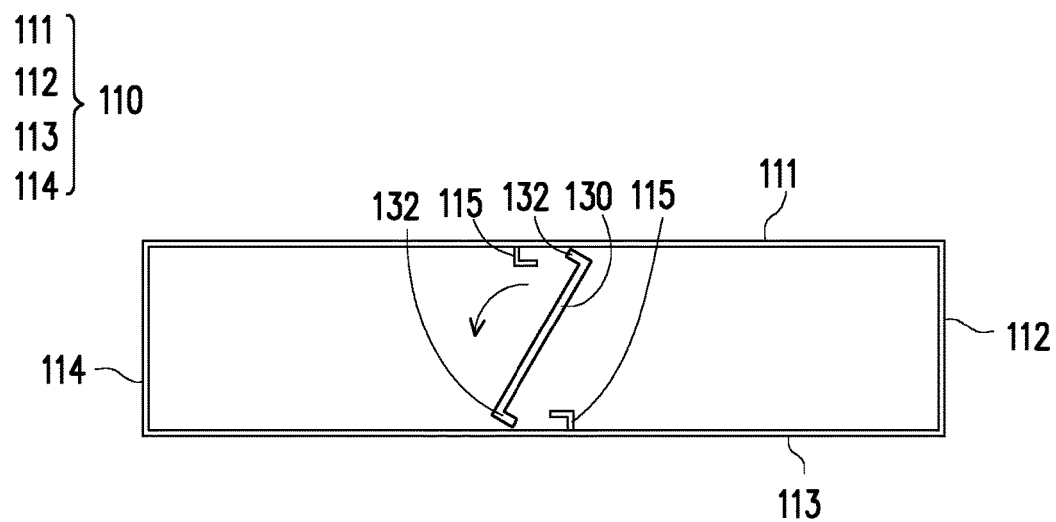
FIG. 4 is a schematic view illustrating installation of the partition structure of FIG. 3 to a casing box.

FIG. 1A is a schematic perspective view illustrating the appearance of a server casing according to an embodiment of the invention. FIG. 1B is a schematic perspective view illustrating a partition structure of the server casing of FIG. 1A. FIG. 2 is a schematic perspective view illustrating the server casing of FIG. 1A from another perspective. FIG. 3 is a schematic partial side view illustrating the server casing of FIG. 1A. FIG. 4 is a schematic view illustrating installation of the partition structure of FIG. 3 to a casing box.

Referring to FIGS. 1 to 4, a server casing 100 of the embodiment includes a casing box 110 and a partition structure 120. In the embodiment, the casing box 110 includes a first lateral wall 111, a second lateral wall 112, a third lateral wall 113, a fourth lateral wall 114 and a fifth lateral wall 116 connected to edges of the first lateral wall 111 and the third lateral wall 113. The first lateral wall 111, the second lateral wall 112, the third lateral wall 113 and the fourth lateral wall 114 are sequentially connected.

More specifically, in the embodiment, the first lateral wall 111, the second lateral wall 112, the third lateral wall 113, and the fifth lateral wall 116 are exterior lateral walls of the casing box 111, whereas the fourth lateral wall 114 is an interior lateral wall of the casing box 110. The first lateral wall 111, the second lateral wall 112, the third lateral wall 113, and the fourth lateral wall 114 may collectively form an accommodating space S adapted to accommodate a server or servers (not shown, and including a motherboard, an extension card, and/or the like). In addition, a space formed by the first lateral wall 111, the fourth lateral wall 114, the third lateral wall 113, and the fifth lateral wall 116 may be adapted to dispose a power module (not shown). Of course, in other embodiments, the first lateral wall 111, the second lateral wall 112, the third lateral wall 113, and the fourth lateral wall 114 adapted to form the accommodating space S accommodating the server or the servers may respectively be interior lateral walls or exterior lateral walls and are not limited to the example shown in FIG. 1A.

The following descriptions will focus on the accommodating space S collectively formed by the first lateral wall 111, the second lateral wall 112, the third lateral wall 113, and the fourth lateral wall 114 and how the partition structure 120 is detachably disposed in the accommodating space S to divide the accommodating space S into a plurality of areas P1 and P2 adapted to accommodate servers in corresponding sizes. In FIGS. 3 and 4, only the accommodating space S formed by a portion of the first lateral wall 111, the second lateral wall 112, a portion of the third lateral wall 113, and the fourth lateral wall 114 is illustrated, and the fifth lateral wall 116 is omitted.

In the embodiment, as shown in FIG. 1B, the partition structure 120 includes a main partition 130 and two main fixing sheet sets 132. The two main fixing sheet sets 132 vertically extend from two opposite edges of the main partition 130 toward opposite directions. Accordingly, a shape similar to a "Z" shape is shown from a side perspective (as shown in FIG. 3). Since the two main fixing sheet sets 132 are perpendicular to the main partition 130, the combination of the main partition 130 and the two main fixing sheet sets 132 do not fully conform to the "Z" shape. The "Z" shape is described herein to depict a structure that the two main fixing sheet sets 132 extend toward opposite directions from two opposite edges of the main partition 130. In addition, each of the main fixing sheet sets 132 has a plurality of discontinuous fixing sheets. However, in other embodiments, the main fixing sheet set 132 may also include a single strip-like fixing sheet. The invention does not intend to impose a limitation on the configuration of the main fixing sheet set 132.

As shown in FIGS. 1A and 2, the two main fixing sheet sets 132 may respectively be detachably fixed to the first lateral wall 111 and the third lateral wall 113 of the casing box 110. The two main fixing sheet sets 132 may be detachably fixed to the first lateral wall 111 and the third lateral wall 113 of the casing box 110 by various means, such as fixing through fastening by a screw 10, engagement, holding, or the like. The designer may choose one or more of the fixing means to detachably fix the two main fixing sheet sets 132 to the first lateral wall 111 and the third lateral wall 113 of the casing box 110. In the embodiment, the two main fixing sheet sets 132 are jointly fixed to the first lateral wall 111 and the third lateral wall 113 in a detachable manner through fastening by the screw 10 and engagement.

As shown in FIG. 1B, the two main fixing sheet sets 132 are respectively divided into two first sections 134 and two second sections 136 in an extending direction of the main partition 130, and the two first sections 134 are closer to a front side (i.e., the right side of FIG. 1A) of the server casing 100 than the second sections 136. In the embodiment, the first sections 134 of the two main fixing sheet sets 132 are fixed to the first lateral wall 111 and the third lateral wall 113 through screw connection, and the second sections 136 of the two main fixing sheet sets 132 are fixed to the first lateral wall 111 and the third lateral wall 113 through engagement. As shown in FIGS. 1A, 2, and 3, in the embodiment, a plurality of hooks 115 are provided on surfaces of the first lateral wall 111 and the third lateral wall 113 of the casing box 110 facing toward each other. The hooks 115 of the first lateral wall 111 and the hooks 115 of the third lateral wall 113 extend in opposite directions and are respectively hooked to the two main fixing sheet sets 132 at the two second sections 136.

The two main fixing sheet sets 132 are designed to be jointly fixed to the first lateral wall 111 and the third lateral wall 113 in a detachable manner through fastening by the screw 10 and engagement for the reasons described in the following. In general, a server is disposed at one of the layers in a cabinet-like server rack. For the ease of maintenance and testing, trays (not shown) similar to drawers that are adapted to be pulled out and pushed back are disposed in the respective layers in the server rack, and servers are fixed to the trays to be pulled out for maintenance or testing. Due to limitations on the mechanical structure and the space of an equipment room, the trays are designed such that only a portion of the trays is pulled out. In other words, the servers on the trays are not completely pulled out. To cope with such case, in the server casing 100 of the embodiment, the two main fixing sheet sets 132 are fixed to the first lateral wall 111 and the third lateral wall 113 by two means. The first sections 134 closer to the front side of the server casing 100 may be pulled out of the server rack, so the user may conveniently remove or fasten the screw 10. The second sections 136 more distant from the front side of the server rack 100 are less likely to be pulled out of the server rack, so the second sections 136 are fixed by the hooks 115.

When removing the partition structure 120, the user only needs to remove the screw 10 corresponding to the first sections 134 and detach the two main fixing sheet sets from the hooks 115 through rotation, and the partition structure 120 is removed from the partition structure 120. Similarly, when installing the partition structure 120, as shown in FIG. 4, the user only needs to insert the partition structure 120 at an inclined angle, insert the two main fixing sheet sets 132 into the hooks 115 by rotating to a predetermined position, and then fasten the screw 10.

In the embodiment, the accommodating space S collectively formed by the first lateral wall 111, the second lateral wall 112, the third lateral wall 113, and the fourth lateral wall 114 is described as a full-width 2 U space, for example. As shown in FIG. 3, in the server casing 100, the accommodating space S is divided into two areas P1 and P2 by the partition structure 120 and is able to accommodate two half-width 2 U servers. Of course, the partition structure 120 may have a plurality of different forms. Partition structures 120a, 120b, 120c, and 120d in different forms are described in the following.

FIGS. 5 to 8 are respectively schematic partial side views illustrating a plurality of server casings according to other embodiments of the invention. In the following embodiments, the descriptions mainly focus on the differences between different embodiments. Therefore, components like or similar to those in the previous embodiments are represented by like or similar reference symbols, and detailed descriptions thereof will not be repeated again.

Figure 5:
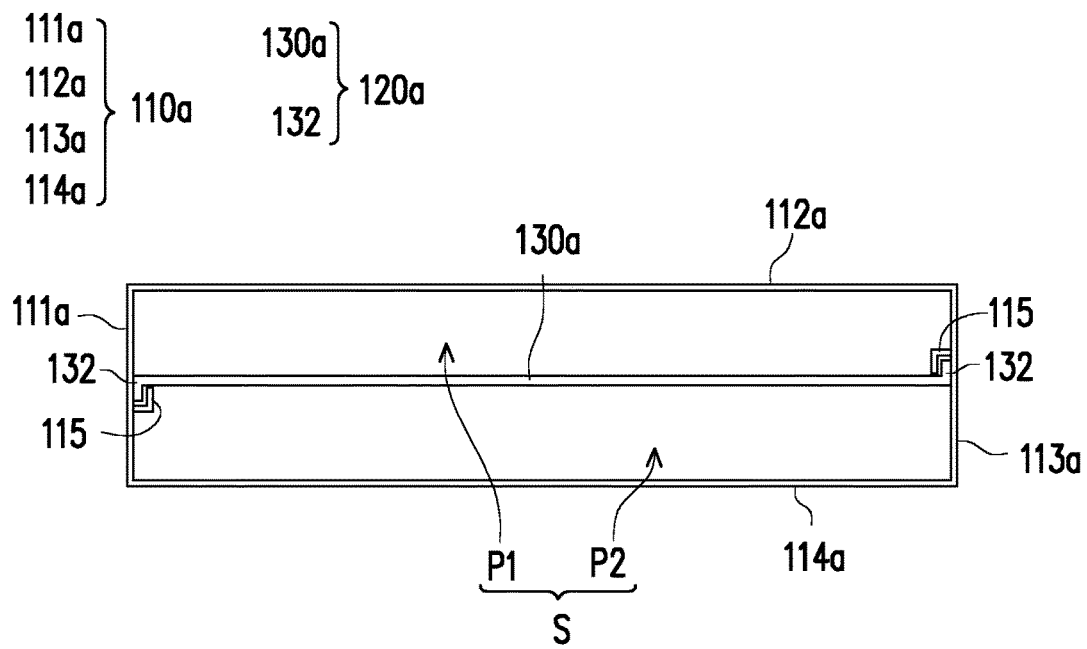
FIGS. 5 to 8 are respectively schematic partial side views illustrating a plurality of server casings according to other embodiments of the invention.

Referring to FIG. 5, the embodiment of FIG. 5 mainly differs from the embodiment of FIG. 3 in that, in the embodiment of FIG. 3, the first lateral wall 111 and the third lateral wall 113 are upper and lower lateral walls, the second lateral wall 112 and the fourth lateral wall 114 are left and right lateral walls, the partition structure 120 is connected to the first (upper) lateral wall 111 and the third (lower) lateral wall 113, and the main partition 130 divides the accommodating space S into the areas P1 and P2 located at the left and the right to accommodate two half-width 2 U servers. In the embodiment of FIG. 5, a first lateral wall 111a and a third lateral wall 113a in a casing box 110 are left and right lateral walls, a second lateral wall 112a and a fourth lateral wall 114a are upper and lower lateral walls. Therefore, a partition structure 120a is connected to the first (left) lateral wall 111a and the third (right) lateral wall 113a, and a main partition 130a divides the accommodating space S into the areas P1 and P2 located at the top and the bottom, so as to accommodate two full-width 1 U servers.

Figure 6:
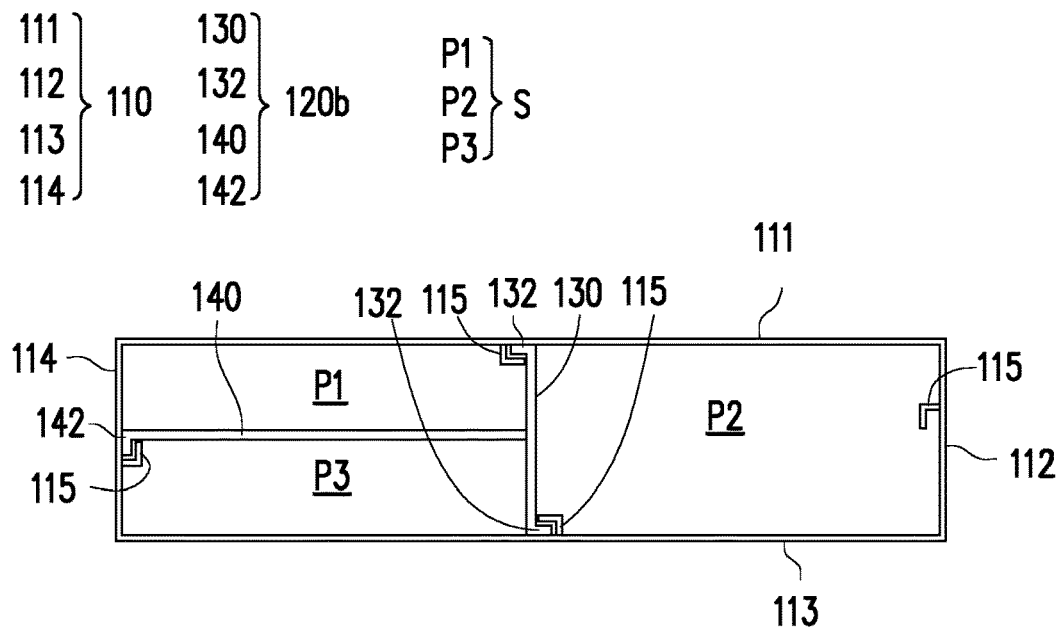

Referring to FIG. 6, a main difference between the embodiment of FIG. 6 and the embodiment of FIG. 3 is that, in the embodiment of FIG. 6, a partition structure 120b further includes a first auxiliary partition 140 and a first auxiliary fixing sheet set 142. The first auxiliary partition 142 vertically extends from a surface (e.g., the left surface as shown in FIG. 6) of the main partition 130, and the first auxiliary fixing sheet set 142 vertically extends from an edge of the first auxiliary partition 140 to be parallel to the main partition 130. In addition, the first auxiliary fixing sheet set 142 is detachably fixed to the fourth lateral wall 114 of the casing box 110. In the embodiment, the first auxiliary fixing sheet set 142 may also be fixed in a way similar to the way adopted for the main fixing sheet set 132. In other words, the first auxiliary fixing sheet set 142 may be detachably fixed to the fourth lateral wall 114 of the casing box 110 through fastening and engagement together.

As shown in FIG. 6, extending directions of the two main fixing sheet sets 132 from the main partition 130 and an extending direction of the first auxiliary fixing sheet set 142 from the first auxiliary partition 140 are all counter-clockwise. Therefore, when the partition structure 120 is to be placed into the accommodating space S, the partition structure 120 shown in FIG. 6 may be slightly rotated an angle in the clockwise direction to be placed into the accommodating space S at an inclined angle, rotated counter-clockwisely to insert the two main fixing sheet sets 132 and the first auxiliary fixing sheet set 142 into the hooks 115, and then fastened by the screw 10. Of course, in other embodiments, the extending directions of the two main fixing sheet sets 132 from the main partition 130 and the extending direction of the first auxiliary fixing sheet set 142 from the first auxiliary partition 140 may all be clockwise, and orientations of the hooks 115 may be changed correspondingly. Accordingly, the two main fixing sheet sets 132 and the first auxiliary fixing sheet set 142 may be inserted into the hooks 115 together through rotation.

In the partition structure 120 of the embodiment, the accommodating space S is divided into three areas P1, P2, and P3. The upper and lower areas P1 and P3 on the left may accommodate two half-width 1 U server, and the area P2 on the right may accommodate one half-width 2 U server. In FIG. 6, the hook 115 is also disposed on the fourth lateral wall 114. Therefore, the user may rotate the partition structure 120 180 degrees to engage the first auxiliary fixing sheet set 142 to the hook 115 on the second lateral wall 112. Accordingly, the left side of the accommodating space S has only one area capable of accommodating a half-width 2 U server, whereas the right side of the accommodating space S is divided into upper and lower areas capable of accommodating two half-width 1 U servers.

Figure 7:
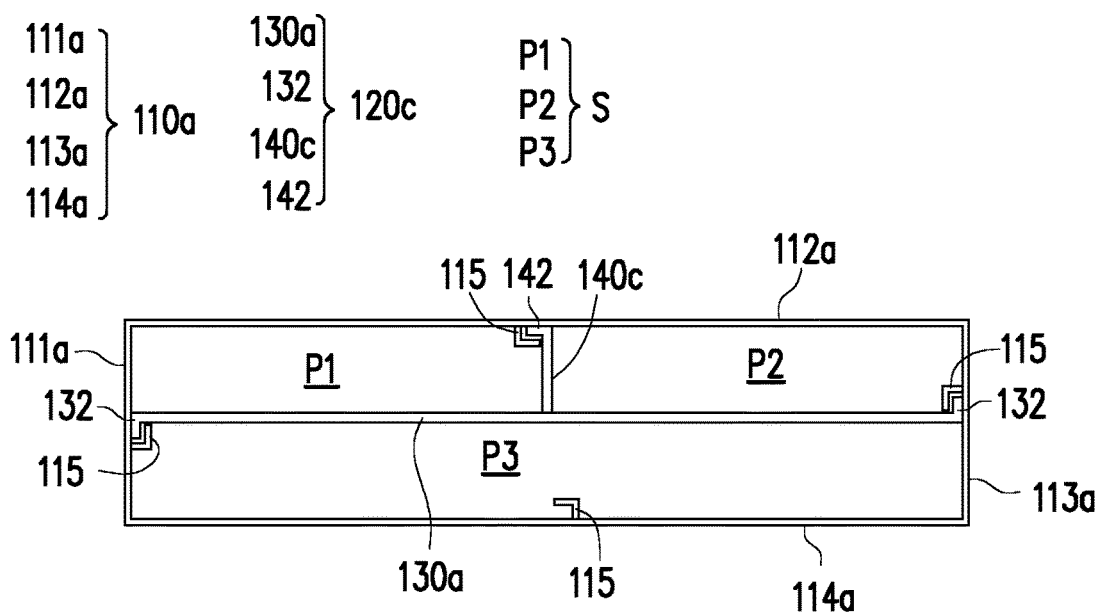

Referring to FIG. 7, a main difference between the embodiment of FIG. 7 and the embodiment of FIG. 5 is that, in the embodiment of FIG. 7, a partition structure 120c further includes a first auxiliary partition 140c and the first auxiliary fixing sheet set 142. The first auxiliary fixing sheet set 142 is detachably fixed to the second lateral wall 112a to divide the accommodating space S into the three areas P1, P2, and P3. The areas P1 and P2 on the left and the right of the upper half may accommodate two half-width 1 U servers, whereas the area P3 at the lower half may accommodate a full-width 1 U server. Similarly, the user may rotate the partition structure 120c 180 degrees to engage the first auxiliary fixing sheet set 142 to the hook 115 of the fourth lateral wall 114a to divide the accommodating space S into three areas. The area at the upper half may accommodate a full-width 1 U server, whereas the left and right areas at the lower half may respectively accommodate two half-width 1 U servers.

Figure 8:
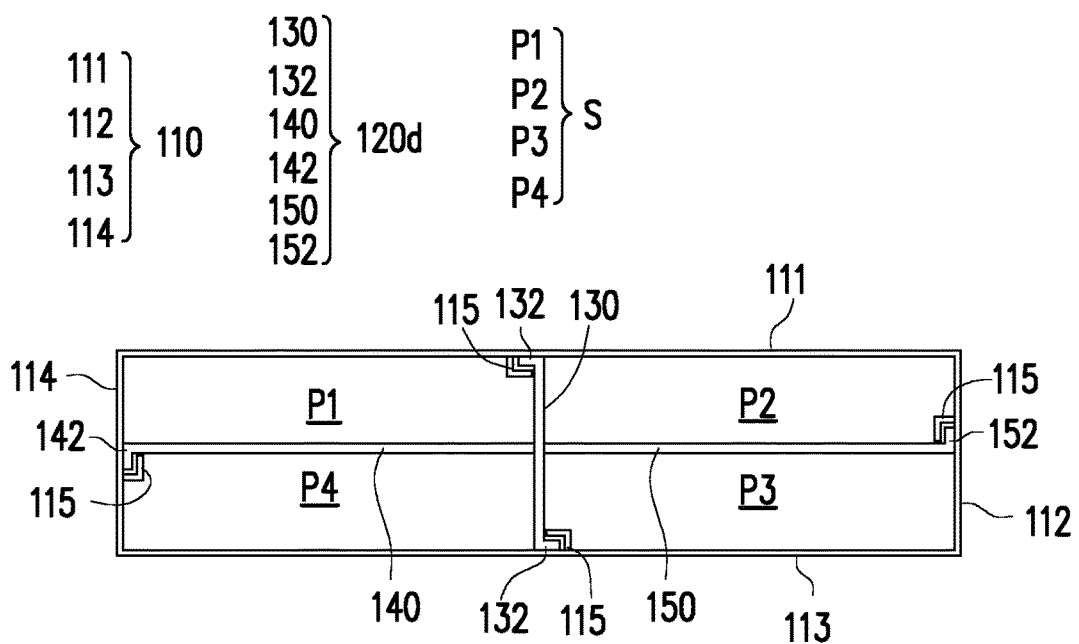

Referring to FIG. 8, the embodiment of FIG. 8 and the embodiment of FIG. 6 mainly differ in that, in the embodiment of FIG. 8, a partition structure 120d further includes a second auxiliary partition 150 and a second auxiliary fixing sheet set 152. The second auxiliary partition 150 vertically extends from another surface of the main partition 130. In other words, the first auxiliary partition 140 and the second auxiliary partition 150 respectively extend from two opposite surfaces (left and right surfaces) of the main partition 130. The second auxiliary fixing sheet set 152 vertically extends from an edge of the second auxiliary partition 150 and is parallel to the main partition 130. In addition, the second auxiliary fixing sheet set 152 is detachably fixed to the fourth lateral wall 114 of the casing box 110. The partition structure 120d of the embodiment divides the accommodating space S into four areas P1, P2, P3, and P4. The areas P1 and P2 on the left and right of the upper half and the areas P3 and P4 on the left and right of the lower half may accommodate four half-width 1 U servers.

Also, as shown in FIG. 8, the extending directions of the two main fixing sheet sets 132 from the main partition 130, the extending direction of the first auxiliary fixing sheet set 142 from the first auxiliary partition 140, and an extending direction of the second auxiliary fixing sheet set 152 from the second auxiliary partition 150 are all counter-clockwise. Of course, in other embodiments, the extending directions of the two main fixing sheet sets 132 from the main partition 130, the extending direction of the first auxiliary fixing sheet set 142 from the first auxiliary partition 140, and the extending direction of the second auxiliary fixing sheet set 152 from the second auxiliary partition 150 may also be all clockwise, and the orientations of the hooks 115 may be changed correspondingly. Accordingly, the two main fixing sheet sets 132, the first auxiliary fixing sheet set 142, and the second auxiliary fixing sheet set 152 may be inserted into the hooks 115 together through rotation.

In the embodiment, the first auxiliary partition 140 and the second auxiliary partition 150 are respectively located at corresponding positions on two opposite surfaces of the main partition 130. However, in other embodiments, it is also possible that the positions of the first auxiliary partition 140 and the second auxiliary partition 150 on the two opposite surfaces of the main partition 130 do not correspond to each other. Moreover, even though one first auxiliary partition 140 and one second auxiliary partition 150 are described in the above embodiment, the numbers of the first auxiliary partition 140 and the second auxiliary partition 150 are not limited thereto.

In view of the foregoing, in the embodiments of the invention, the partition structure is detachably disposed in the casing box of the server casing. Accordingly, the user may decide whether to replace the partition structure or to not use the partition structure. In addition, the two main fixing sheet sets of the partition structure respectively extend from two opposite edges of the main partition, and are perpendicular to the main partition and extend in opposite directions. Therefore, the shape of the main partition and the two main fixing sheet set is close to a "Z" shape. When the partition structure is desired to be detached from the casing box, the user may firstly release a fixing relation (e.g., releasing the fastening and/or engagement relation) between the two main fixing sheet sets and the first and third lateral walls, and then rotate the partition structure to an inclined position, and the partition structure can be removed. By designing the shape of the main partition and the two main fixing sheet sets to be similar to the "Z" shape, the interference of the first and third lateral walls during rotation may be avoided. Similarly, when the partition structure is desired to be installed to the casing box, the user may place the main partition and the two main fixing sheet sets in the "Z" shape into the casing box at an inclined angle, and then rotate the partition structure to a position where the two main fixing sheet sets to be parallel to the first and third lateral walls of the casing box. By designing the shape of the main partition and the two main fixing sheet sets to be similar to the "Z" shape, the interference of the first and third lateral walls during rotation may be avoided, and the two main fixing sheet sets may be rotated to the predetermined positions. Then, the two main fixing sheet sets are fixed to the first lateral wall and the third lateral walls. Thus, with the server casing according to the embodiments of the invention, the user may adjust sizes of areas divided by the partition structure in the casing box according to sizes of the servers desired to be installed in the server casing. Thus, the user has more flexibility to make adjustment. Moreover, the Z-shaped design avoids the interference with respect to the casing box during installation or removal, so the partition structure is easy to install and remove.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A server casing, comprising:
   a casing box, comprising a first lateral wall, a second lateral wall, a third lateral wall, and a fourth lateral wall sequentially connected and collectively forming an accommodating space; and
   a partition structure, detachably disposed in the casing box to divide the accommodating space into a plurality of areas and comprising a main partition and two main fixing sheet sets, wherein the two main fixing sheet sets vertically extend from two opposite edges of the main partition in opposite directions, respectively, the two main fixing sheet sets are parallel to the first lateral wall and the third lateral wall and are detachably fixed to the first lateral wall and the third lateral wall of the casing box,
   wherein a plurality of hooks are respectively provided on surfaces of the first lateral wall and the third lateral wall of the casing box facing toward each other, the hooks of the first lateral surface and the hooks of the third lateral surface extend in opposite directions and are respectively hooked to the two main fixing sheet sets.

2. The server casing as claimed in claim 1, wherein the two main fixing sheet sets are fastened to the first lateral wall and the third lateral wall by at least one screw.

3. The server casing as claimed in claim 2, wherein the two main fixing sheet sets are respectively divided into two first sections and two second sections in an extending direction of the main partition, the two first sections are closer to a front side of the server casing than the two second sections, and the two main fixing sheet sets respectively comprise a plurality of screw holes located in the two first sections.

4. The server casing as claimed in claim 1, wherein the two main fixing sheet sets are respectively divided into two first sections and two second sections in an extending direction of the main partition, the two first sections are closer to a front side of the server casing than the two second sections, and the hooks are respectively hooked to the two second sections of the two main fixing sheet sets.

5. The server casing as claimed in claim 1, wherein the partition structure further comprises a first auxiliary partition and a first auxiliary fixing sheet set, the first auxiliary partition vertically extends from a surface of the main partition, the first auxiliary fixing sheet set vertically extends from an edge of the first auxiliary partition and is parallel to the main partition, and the first auxiliary fixing sheet set is detachably fixed to one of the second lateral wall and the fourth lateral wall of the casing box.

6. The server casing as claimed in claim 5, wherein extending directions of the two main fixing sheet sets from the main partition and an extending direction of the first auxiliary fixing sheet set from the first auxiliary partition are all clockwise or are all counter-clockwise.

7. The server casing as claimed in claim 5, wherein the partition structure further comprises a second auxiliary partition and a second auxiliary fixing sheet set, the second auxiliary partition vertically extends from another surface of the main partition, the second auxiliary fixing sheet set vertically extends from an edge of the second auxiliary partition and is parallel to the main partition, and the second auxiliary fixing sheet set is detachably fixed to the other of the second lateral wall and the fourth lateral wall of the casing box.

8. The server casing as claimed in claim 7, wherein extending directions of the two main fixing sheet sets from the main partition, an extending direction of the first auxiliary fixing sheet set from the first auxiliary partition, and an extending direction of the second auxiliary fixing sheet set from the second auxiliary partition are all clockwise or are all counter-clockwise.

9. The server casing as claimed in claim 7, wherein the first auxiliary partition and the second auxiliary partition are respectively located at corresponding positions on two opposite surfaces of the main partition.

* * * * *